United States Patent
Ji et al.

(10) Patent No.: US 10,578,938 B2
(45) Date of Patent: Mar. 3, 2020

(54) ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xinyou Ji, Beijing (CN); Yanqiang Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 44 days.

(21) Appl. No.: 15/767,794

(22) PCT Filed: Sep. 30, 2017

(86) PCT No.: PCT/CN2017/104758
§ 371 (c)(1),
(2) Date: Apr. 12, 2018

(87) PCT Pub. No.: WO2018/192189
PCT Pub. Date: Oct. 25, 2018

(65) Prior Publication Data
US 2019/0086753 A1 Mar. 21, 2019

(30) Foreign Application Priority Data

Apr. 19, 2017 (CN) .......................... 2017 1 0256719

(51) Int. Cl.
*G02F 1/1362* (2006.01)
*G06F 3/041* (2006.01)
*G02F 1/1345* (2006.01)

(52) U.S. Cl.
CPC ...... *G02F 1/136286* (2013.01); *G06F 3/0416* (2013.01); *G02F 1/1345* (2013.01);
(Continued)

(58) Field of Classification Search
None
See application file for complete search history.

(56) References Cited

U.S. PATENT DOCUMENTS

| | | |
|---|---|---|
| 2014/0099736 A1 | 4/2014 | Lee et al. |
| 2016/0117039 A1 | 4/2016 | Zhao |

(Continued)

FOREIGN PATENT DOCUMENTS

| | | |
|---|---|---|
| CN | 101697053 A | 4/2010 |
| CN | 104298404 A | 1/2015 |

(Continued)

OTHER PUBLICATIONS

First Office Action for Chinese Application No. 201710256719.5, dated Mar. 12, 2019, 8 Pages.

(Continued)

*Primary Examiner* — Phu Vu
(74) *Attorney, Agent, or Firm* — Brooks Kushman P.C.

(57) ABSTRACT

An array substrate includes a base substrate and at least three layers of signal lines insulated from each other and arranged in a non-display region. The signal lines include first signal lines in a first layer and second signal lines in a second layer extending in an identical direction, and third signal lines in a third layer crossing the first and the second signal lines. A distance between each third signal line and the base substrate is larger than a distance between each first/second signal line and the base substrate. An orthogonal projection of each first signal line on the base substrate overlaps that of the corresponding third signal line to form a first overlapping region, an orthogonal projection of each second signal (Continued)

line overlaps that of the corresponding third signal line to form a second overlapping region which partially overlaps, or does not overlap, the first overlapping region.

17 Claims, 5 Drawing Sheets

(52) U.S. Cl.
CPC .............. *G02F 2001/13629* (2013.01); *G06F 2203/04103* (2013.01)

(56) References Cited

U.S. PATENT DOCUMENTS

| | | |
|---|---|---|
| 2016/0188083 A1 | 6/2016 | Shi et al. |
| 2016/0291769 A1 | 10/2016 | Wang |
| 2016/0322402 A1 | 11/2016 | Kim et al. |
| 2016/0370945 A1 | 12/2016 | Qu |
| 2017/0147123 A1 | 5/2017 | Wang et al. |
| 2018/0053792 A1* | 2/2018 | Shin .................... H01L 27/1218 |

FOREIGN PATENT DOCUMENTS

| | | |
|---|---|---|
| CN | 104393025 A | 3/2015 |
| CN | 104571720 A | 4/2015 |
| CN | 104698711 A | 6/2015 |
| CN | 104808411 A | 7/2015 |
| CN | 104865756 A | 8/2015 |
| CN | 105094479 A | 11/2015 |
| CN | 106898623 A | 6/2017 |

OTHER PUBLICATIONS

International Search Report and Written Opinion for Application No. PCT/CN2017/104758, dated Dec. 26, 2017, 12 Pages.

* cited by examiner

ARRAY SUBSTRATE AND DISPLAY DEVICE

CROSS-REFERENCE TO RELATED APPLICATION APPLICATIONS

This application is the U.S. national phase of PCT Application No. PCT/CN2017/104758 filed on Sep. 30, 2017, which claims priority to Chinese Patent Application No. 201710256719.5 filed on Apr. 19, 2017, which are incorporated herein by reference in their entireties.

TECHNICAL FIELD

The present disclosure relates to the field of display technologies, in particular to an array substrate and a display device.

BACKGROUND

TFT-LCD (Thin Film Transistor-Liquid Crystal Display) products are continuously improved and updated, which enables lines on a TFT-LCD array substrate to be denser, especially the lines in a fanout region of a non-display region. Referring to FIGS. 1 and 2, FIG. 1 is a bottom view of a fanout region of an array substrate in the related art, and FIG. 2 is a sectional view of the array substrate as shown in FIG. 1 taken in an A-A direction. The non-display region of the array substrate is provided with a base substrate 101, a gate metal line 102, a gate insulation layer 103, a data signal line 104, a passivation layer (PVX) 105 and a touch signal line 106. As can be seen from FIG. 2, there is an angle between an extending direction of the touch signal line 106 and an extending direction of the gate metal line 102, as well as an angle between the extending direction of the touch signal line 106 and an extending direction of the data signal line 104, a step difference of the touch signal line 106 at an intersection region between the touch signal line 106 and the gate metal line 102 as well as the data signal line 104, the touch signal line 106 is easily fractured at the intersection region (as shown in FIG. 3), which affects touch control.

SUMMARY

In view of the above, the present disclosure provides an array substrate and a display device, so as to prevent a signal line in a non-display region of an array substrate from being fractured due to a large step difference at an intersection region between the signal line and another signal line arranged below the signal line.

In order to solve the above technical problem, the present disclosure provides an array substrate. The array substrate includes: a base substrate, where the base substrate includes a display region and a non-display region; and at least three layers of signal lines insulated from each other and arranged in the non-display region, where the at least three layers of signal lines includes first signal lines in a first layer and second signal lines in a second layer extending in an identical direction, and third signal lines in a third layer crossing the first signal lines and the second signal lines. A distance between each third signal line and the base substrate is larger than a distance between each first signal line and the base substrate and larger than a distance between each second signal line and the base substrate, an orthogonal projection of each first signal line on the base substrate overlaps an orthogonal projection of the corresponding third signal line on the base substrate to form a first overlapping region, an orthogonal projection of each second signal line on the base substrate overlaps an orthogonal projection of the corresponding third signal line on the base substrate to form a second overlapping region, and the first overlapping region partially overlaps, or does not overlap, the second overlapping region.

Optionally, each of the second signal lines includes linear portions and protruding portions which are alternately arranged, an extending direction of each linear portion is perpendicular or substantially perpendicular to an extending direction of the third signal line, a protruding direction of each protruding portion is angled relative to the extending direction of the linear portion, and the first overlapping region partially overlaps, or does not overlap, an orthogonal projection of the corresponding protruding portion on the base substrate.

Optionally, each of the protruding portions protrudes toward the extending direction of the third signal line.

Optionally, the protrusion portions correspond to the third signal lines respectively.

Optionally, an orthogonal projection of each protrusion portion on the base substrate is within the orthogonal projection of the corresponding third signal line on the base substrate.

Optionally, a width of each protruding portion in the extending direction of the second signal line is smaller than or equal to a width of the third signal line in the extending direction of the second signal line.

Optionally, each of the first signal lines is a straight line.

Optionally, each of the protruding portions is of a right-angled U-shape.

Optionally, a depth of a U-shaped groove of each protruding portion is equal to a width of the first signal line in the extending direction of the third signal line.

Optionally, the orthogonal projection of each first signal line on the base substrate does not overlap an orthogonal projection of a bottom of the U-shaped groove of the corresponding protruding portion on the base substrate.

Optionally, the first overlapping region does not overlap the second overlapping region.

Optionally, the third signal line is one of the at least three layers of signal lines farthest from the base substrate.

Optionally, a gate metal line, a first insulation layer, a data signal line, a second insulation layer and a touch signal line are sequentially arranged in the non-display region of the array substrate, one of the gate metal line and the data signal line is the first signal line, the other one of the gate metal line and the data signal line is the second signal line, and the touch signal line is the third signal line.

The present disclosure further provides a display device, including the above array substrate.

The beneficial effects of the above technical solution of the present disclosure are as follows. In the embodiment of the present disclosure, within an intersection region where the third signal line crosses the first signal line and the second signal line there exists at least a region where only one of the first signal line and the second signal line is arranged. In such a manner, it is able to appropriately reduce a step difference of the third signal line at the intersection region, and prevent the third signal line from being fractured at the intersection region due to a large step difference, and improve reliability of the array substrate.

DETAILED DESCRIPTION

In order to make the object, technical solutions and advantages of embodiments of the present disclosure clearer, hereinafter technical solutions of the embodiments of the present disclosure will be described clearly and completely in conjunction with drawings of the embodiments of the present disclosure. Apparently, the described embodiments are merely a few rather than all of the embodiments of the present disclosure. All other embodiments obtained by persons of ordinary skill in the art based on the embodiments of the present disclosure without creative efforts shall fall within the protection scope of the present disclosure.

Reference is made to FIGS. 4 to 8. An array substrate is provided according to some embodiments of the present disclosure. The array substrate includes a base substrate 201 and at least three layers of signal lines insulated from each other. The base substrate 201 includes a display region and a non-display region, and the at least three layers of signal lines are arranged in the non-display region. The at least three layers of signal lines includes first signal lines 202 in a first layer and second signal lines 204 in a second layer extending in an identical direction, and third signal lines 206 in a third layer crossing the first signal lines 202 and the second signal lines 204. A distance between each third signal line 206 and the base substrate 201 is larger than a distance between each first signal line 202 and the base substrate 201 and larger than a distance between each second signal line 204 and the base substrate 201. An orthogonal projection of each first signal line 202 on the base substrate 201 overlaps an orthogonal projection of the corresponding third signal line 206 on the base substrate 201 to form a first overlapping region, an orthogonal projection of each second signal line 204 on the base substrate 201 overlaps an orthogonal projection of the corresponding third signal line 206 on the base substrate 201 to form a second overlapping region, and the first overlapping region partially overlaps, or does not overlap, the second overlapping region.

In some embodiments, the distance between each first signal line 202 and the base substrate 201 is smaller than a distance between each second signal line 204 and the base substrate 201.

It should be noted that different layers in the at least three layers may represent layers having different distances from the base substrate 201, or represent different film layers in the process of manufacturing the base substrate. In addition, one or more first signal lines 202 may be arranged in the first layer, one or more second signal lines 204 may be arranged in the second layer, and one or more third signal lines 206 may be arranged in the third layer.

Figure 8:
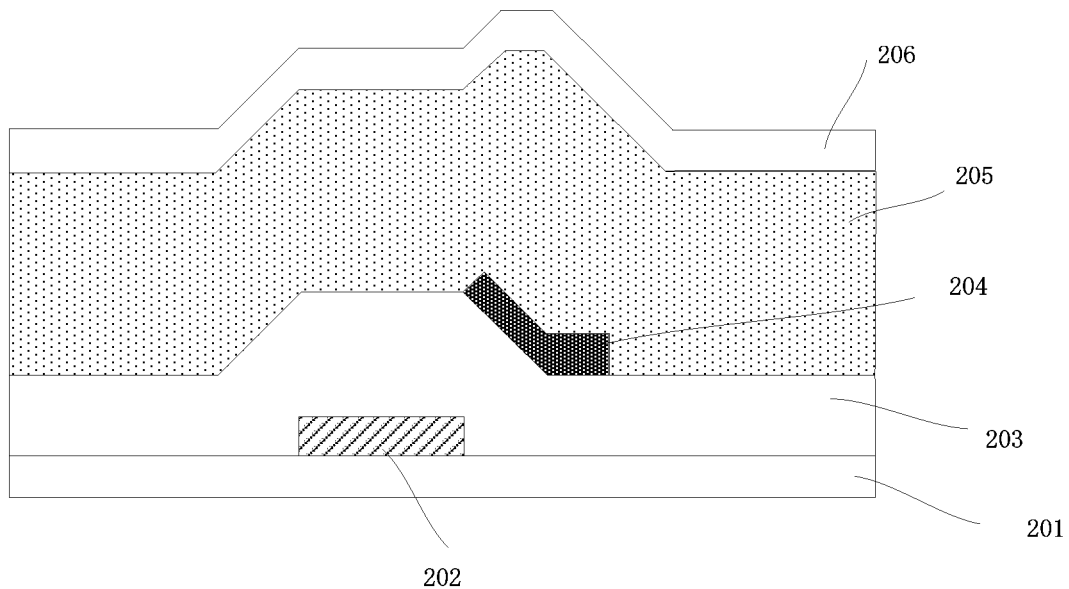
FIG. 8 is a sectional view of the array substrate as shown in FIG. 6 taken in a B-B direction.

Reference is made to FIG. 8. In the embodiments of the present disclosure, the first signal line 202 and the second signal line 204 are both located below the third signal line 206 and both across the third signal line 206, and an extending direction of the first signal line 202 and the second signal line 204 is different from an extending direction of the third signal line 206. In order to reduce a step difference of the third signal line 206 at an intersection region, the first overlapping region between the orthogonal projection of of each first signal line 202 on the base substrate 201 and the orthogonal projection of the corresponding third signal line 206 on the base substrate 201 is arranged to partially overlap or not overlap the second overlapping region between the orthogonal projection of each second signal line 204 on the base substrate 201 and the corresponding third signal line 206 on the base substrate 201. That is, at an intersection region of the third signal line 206, there at least exists part of the intersection region, below which only one of the first signal line 202 and the second signal line 204 is arranged. In such a manner, it is able to appropriately reduce the step difference of the third signal line 206 at the intersection region, prevent the third signal line 206 from being fractured at the intersection region due to the large step difference, and improve reliability of array substrate.

In the embodiments of the present disclosure, the signal lines in the non-display region of the array substrate may be arranged in three or more layers.

Optionally, the third signal line 206 is a signal line located on a top layer, that is, a distance between the third signal line 206 and the substrate substrate 201 is the largest. In a case that the signal lines are arranged in more than three layers, the third signal line 206 may be in a middle layer.

Figure 6:
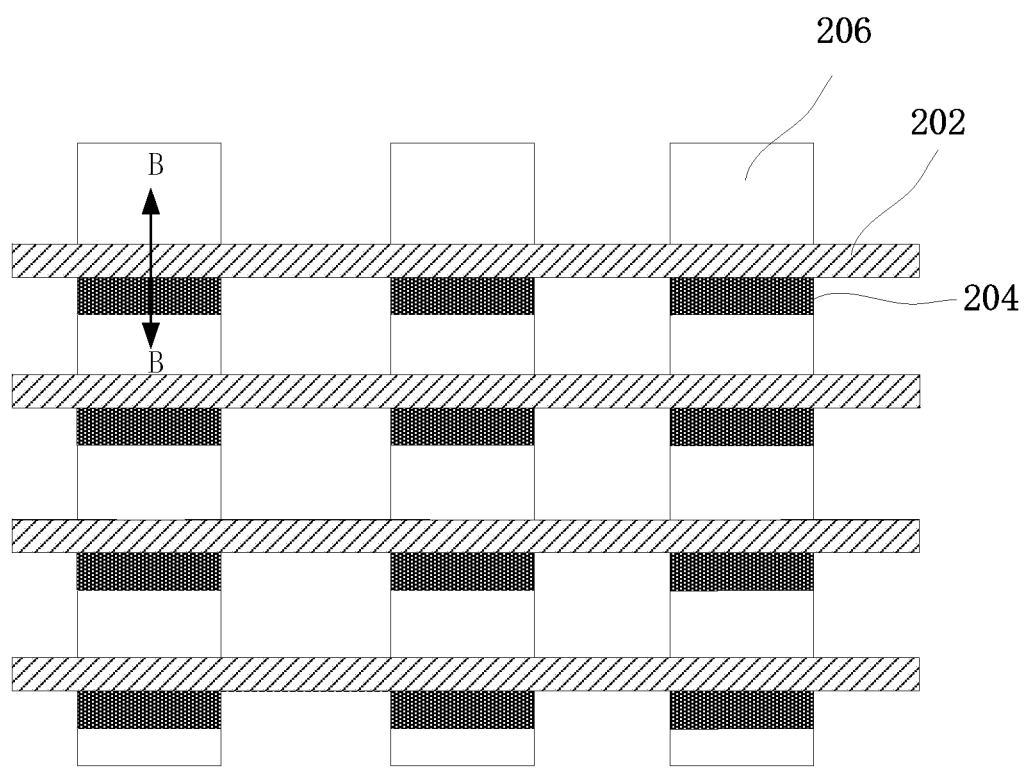
FIG. 6 is a bottom view of first signal lines, second signal lines and third signal lines on an array substrate according to some embodiments of the present disclosure.

Reference is made to FIG. 6. In the embodiments of the present disclosure, the extending direction of the first signal line 202 and the second signal line 204 (a transverse direction in the embodiments of the present disclosure) is perpendicular or substantially perpendicular to the extending direction of the third signal line 206 (a longitudinal direction in the embodiments of the present disclosure). Optionally, in some other embodiments of the present disclosure, it is not limited to that the extending direction of the third signal line 206 is perpendicular to the extending direction of the first signal line 202 and the second signal line 204.

In the embodiments of the present disclosure, in order to achieve the first overlapping region partially overlapping, or not overlapping the second overlapping region, the second signal line may include a protruding portion and a linear portion, an extending direction of the linear portion is perpendicular to the extending direction of the third signal line, and a protruding direction of the protruding portion is angled relative to the extending direction of the linear portion. Optionally, the second signal line may include a plurality of protruding portions, and adjacent two protruding portions are connected via one linear portion. Further, the plurality of projections is arranged in a same interval.

Figure 4:
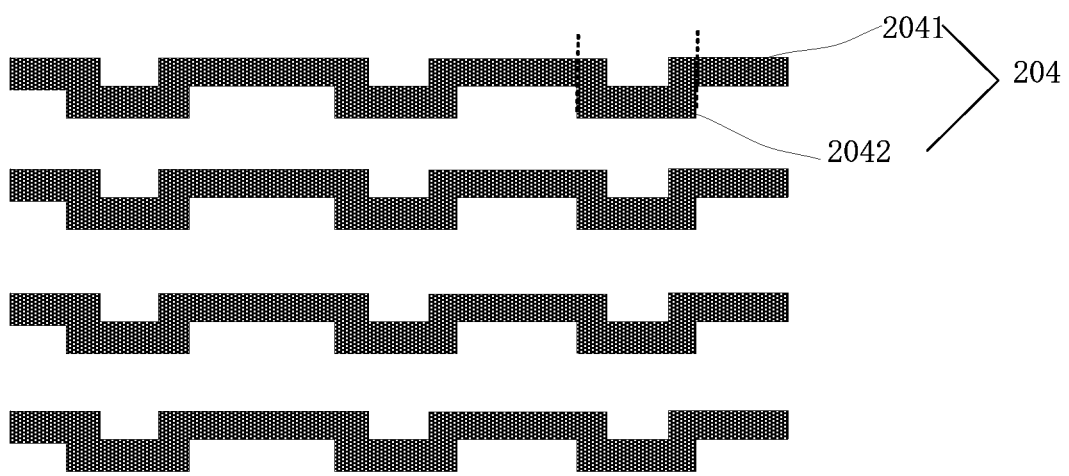
FIG. 4 is a schematic diagram of second signal lines formed on an array substrate according to some embodiments of the present disclosure.

Reference is made to FIG. 4. In some embodiments, each of the second signal lines 204 includes a plurality of linear portions 2041 and a plurality of protruding portions 2042 (as shown in FIG. 4, the linear portions 2041 and the protruding portions 2042 are divided by dotted lines) connected with each other. The straight portions 2041 and the protruding portions 2042 are alternately arranged. Each of the protruding portion 2042 protrudes towards the extending direction of the third signal line 206 (the longitudinal direction in the embodiments of the present disclosure), and the protruding portions 2042 are arranged in one-to-one correspondence with the third signal lines 206. For example, the protruding portions 2042 may be arranged at the intersection regions between the second signal lines 204 and at least one of the third signal lines 206 and arranged protruding towards the extending direction of the third signal line 206. In some embodiments, referring to FIGS. 6 and 8, the first overlapping region between the orthogonal projection of of each first signal line 202 on the base substrate 201 and the orthogonal projection of the corresponding third signal line 206 on the base substrate 201 does not completely overlap the orthogonal projection of each protruding portion 2042 on the base substrate 201. That is, at an intersection region of the third signal line 206, there at least exists part of the intersection region, below which only one of the first signal line 202 and the second signal line 204 is arranged. In such a manner, it is able to appropriately reduce a step difference of the third signal line 206 at the intersection region, prevent the third signal line 206 from being fractured at the intersection region due to the large step difference, and improve reliability of the array substrate.

Reference is made to FIG. 4. In the embodiments of the present disclosure, the second signal line 204 includes a plurality of protruding portions 2042, and each of the protruding portions 2042 is of a right-angled U-shape. A shape of the protruding portion 2042 is not limited herein, and may be of other shapes, for example, a U-shape, an arc shape, and a semi-circular shape.

In the embodiments of the present disclosure, the number of protruding portions 2042 of each second signal line 204 is identical to the number of the third signal lines 206, and the protruding portions 2042 of each second signal line 204 is arranged in a one-to-one correspondence with the third signal lines 206. That is, all the third signal lines 206 are designed in a ramp-buffered manner. Optionally, in some embodiments, the number of the protruding portions 2042 of one of the second signal lines 204 is smaller than the number of the third signal lines 206, that is, only part of the third signal lines 206 are designed in the ramp-buffered manner.

In the process of aligning the array substrate to an substrate opposite to the array substrate to form a cell, a sealant configured to encapsulate the array substrate and the opposite substrate is required to be irradiated by ultraviolet (UV) light, and the area of the orthogonal projection of the signal lines in the non-display region of the array substrate on the base substrate affects an aperture ratio of UV light irradiation. The smaller the area is, the larger the aperture ratio is, and the better solidification effect of the sealant is.

Figure 1:
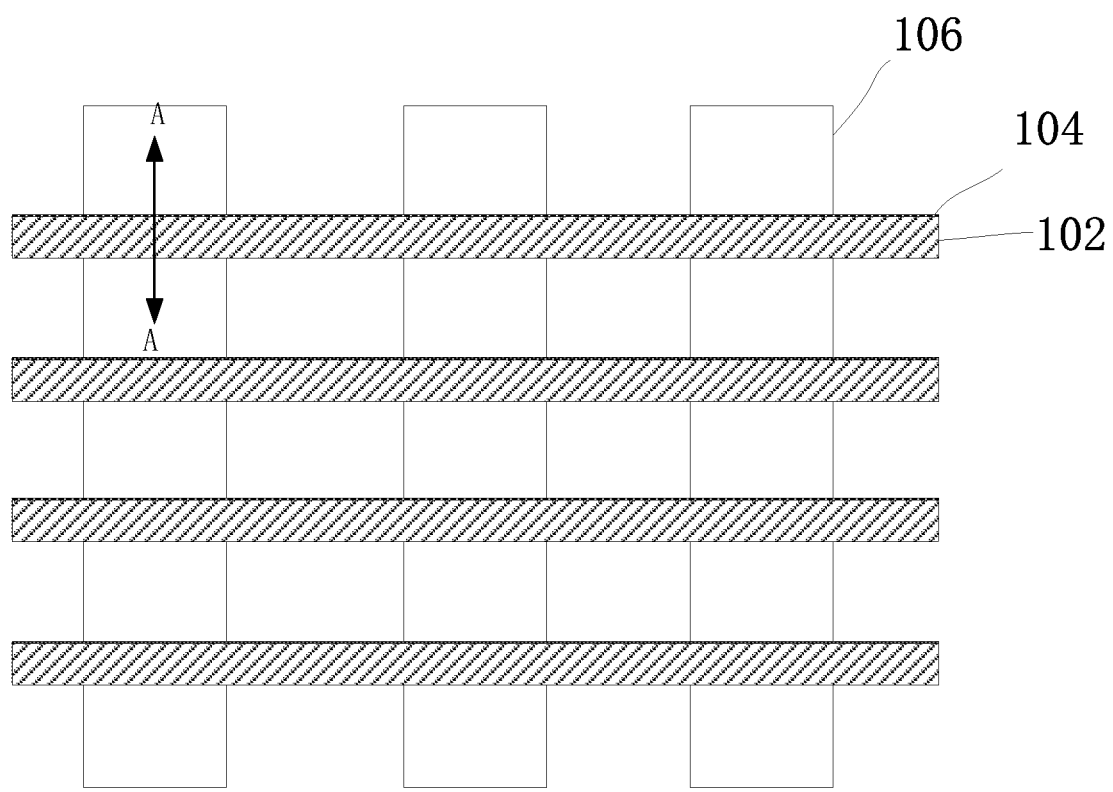
FIG. 1 is a bottom view of a fanout region of a TDDI array substrate in the related art.
Figure 2:
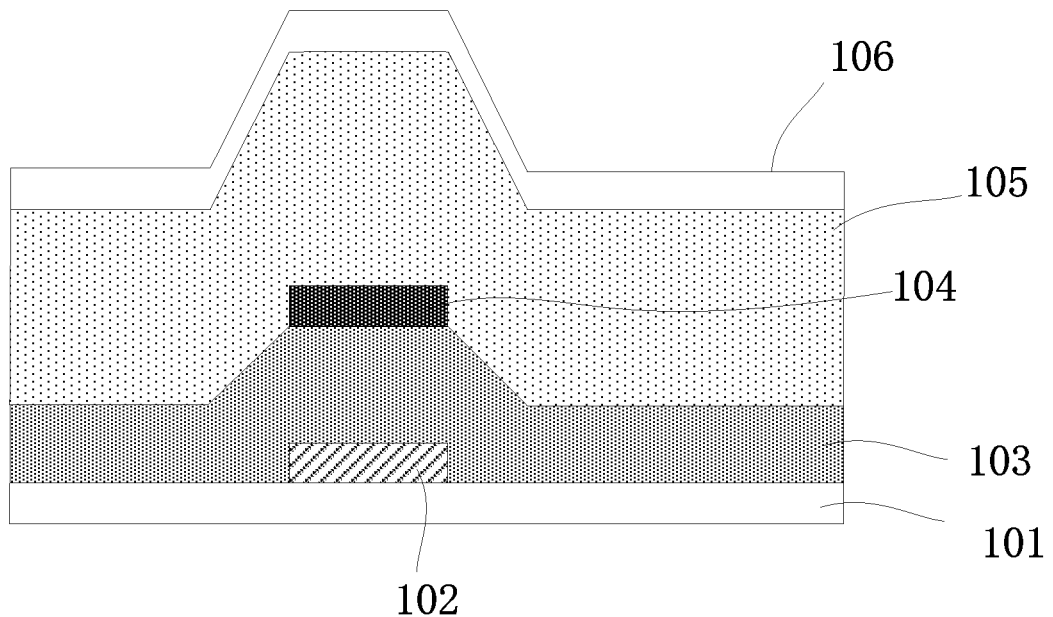
FIG. 2 is a sectional view of the array substrate as shown in FIG. 1 taken in an A-A direction.
Figure 3:
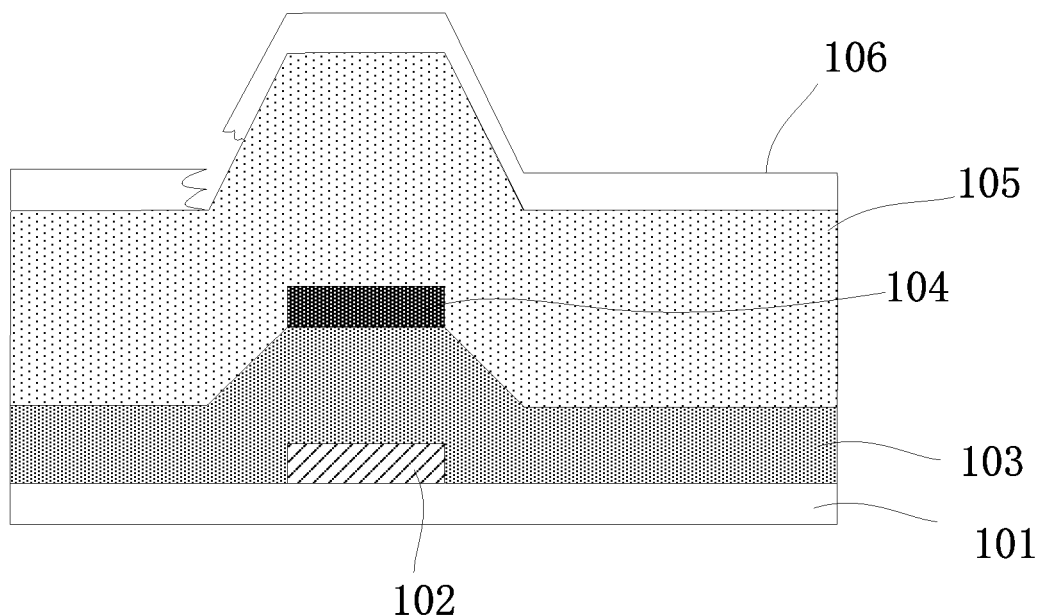
FIG. 3 is a schematic diagram of the array substrate as shown in FIG. 2 with a fractured touch signal line.
Figure 7:
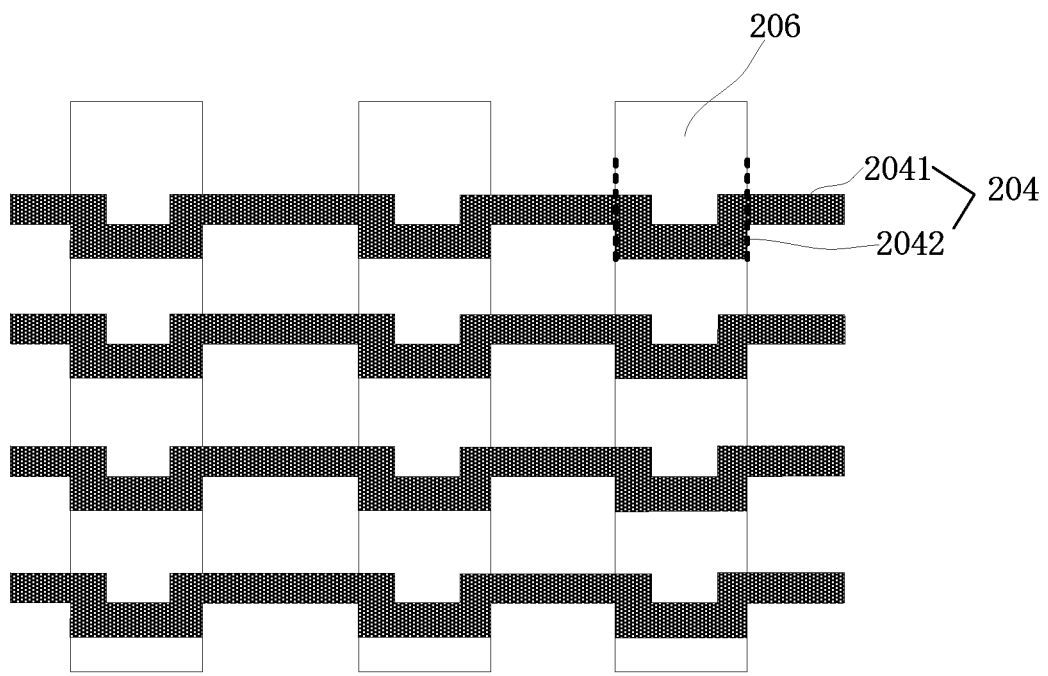
FIG. 7 is a bottom view of second signal lines and third signal lines on an array substrate according to some embodiments of the present disclosure.

Reference is made to FIG. 7. In the embodiments of the present disclosure, in order not to affect the aperture ratio of UV light irradiation, optionally, the orthogonal projection of the projecting portion 2042 of the second signal line 204 on the base substrate 201 is within the the orthogonal projection of the third signal line 206 on the base substrate 201. That is, the area of the orthogonal projection of the signal lines of the non-display region on the base substrate is basically the same as compared with the array substrate (as shown in FIG. 1) in the related art, thereby not affecting the aperture ratio of the UV light irradiation even in the case that the step difference of the third signal line 206 is reduced.

Figure 9:
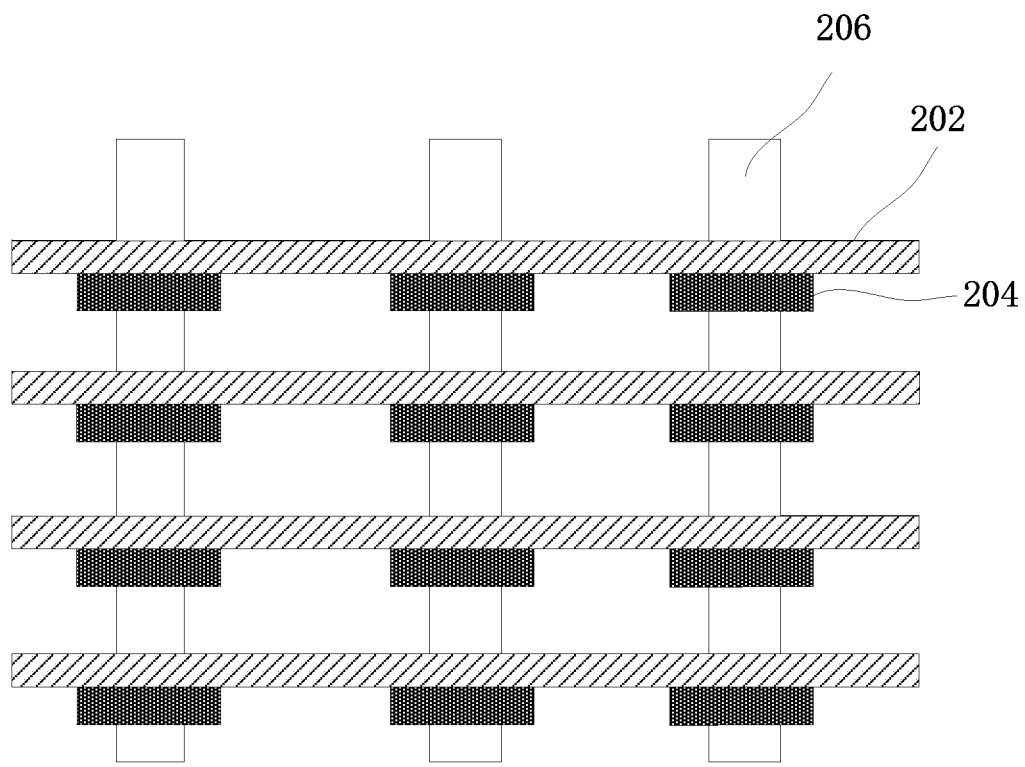
FIG. 9 is a bottom view of first signal lines, second signal lines and third signal lines on an array substrate according to some other embodiments of the present disclosure.
Figure 10:
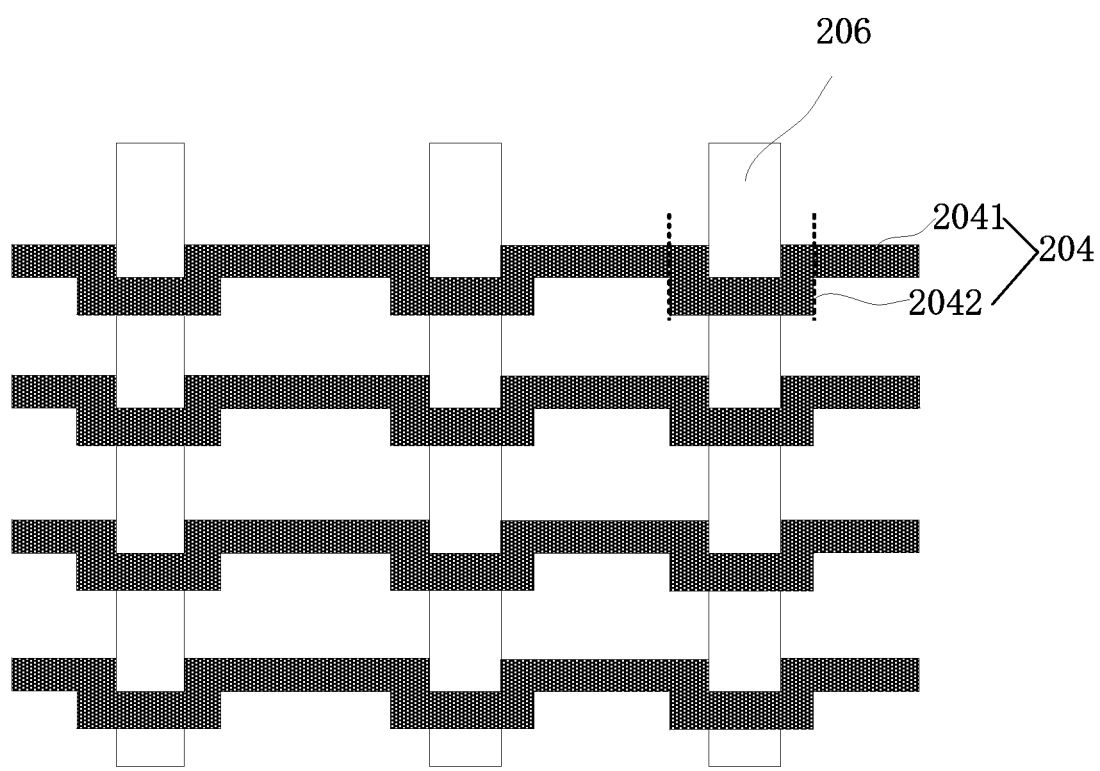
FIG. 10 is a bottom view of second signal lines and third signal lines on an array substrate according to some other embodiments of the present disclosure.

Reference is made to FIGS. 9 and 10. In some other embodiments of the present disclosure, if the requirement for the aperture ratio of the UV light irradiation is not so high, the orthogonal projection of the projecting portion 2042 of the second signal line 204 on the base substrate 201 may also not overlap the orthogonal projection of the first signal line 202 on the base substrate 201, i.e., the first overlapping region between the orthogonal projection of the first signal line 202 on the base substrate 201 and the orthogonal projection of the third signal line 206 on the base substrate 201 does not overlap the second overlapping region between the orthogonal projection of the second signal line 204 on the base substrate 201 and the orthogonal projection of the third signal line 206 on the base substrate 201. In such a structure, only one of the first signal line 202 and the second signal line 204 is below the whole intersection region of the third signal line 206, which may greatly reduce the step difference of the third signal line 206 at the intersection region, prevent the third signal line 206 from being fractured at the intersection region due to the large step difference of the third signal line 206, and improve reliability of the array substrate.

Reference is made to FIG. 7. In some optional embodiments of the present disclosure, a width of the protruding portion 2042 of the second signal line 204 in the extending direction (a transverse direction in the embodiments of the present disclosure) of the second signal line 204 is equal to a width of the third signal line 206 in the extending direction of the second signal line.

In the embodiments of the present disclosure, each of the first signal lines 202 is a straight line. Optionally, in some other embodiments of the present disclosure, the first signal lines 202 may be of other shapes.

Figure 5:
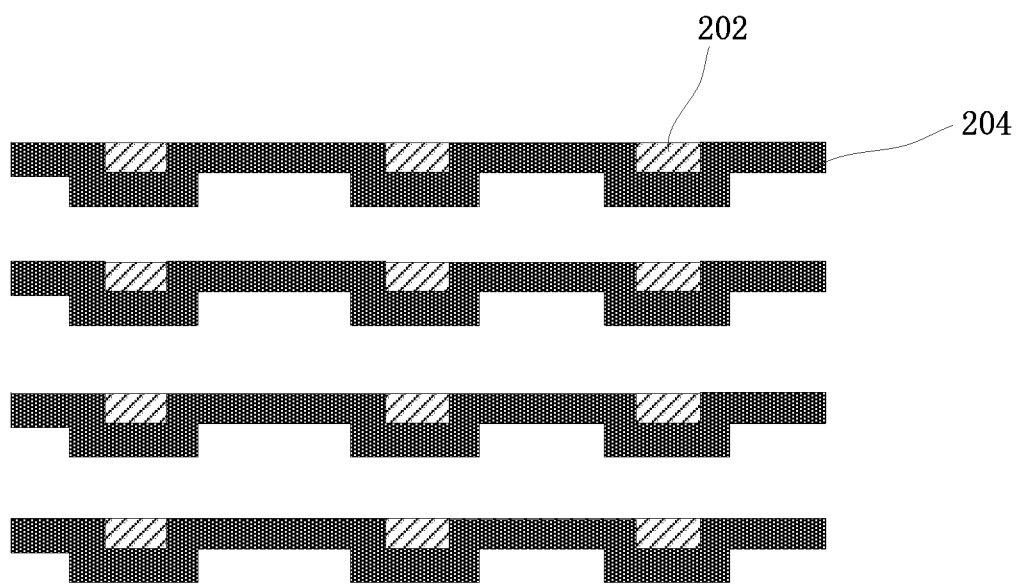
FIG. 5 is a bottom view of first signal lines and second signal lines on an array substrate according to some embodiments of the present disclosure.

In the embodiments of the present disclosure, the protruding portion 2042 of the second signal line 204 is of a right-angled U-shape. Reference is made to FIG. 5, optionally, a depth of a U-shaped groove of the protruding portion 2041 is equal to a width of the first signal line 202 in the extending direction of the third signal line 206 (a longitudinal direction in the embodiments of the present disclosure), so that the second signal line 204 is made with least materials.

In the above embodiments, the shape of the second signal line 204 is changed to reduce the step difference of the third signal line 206. Optionally, in some other embodiments of the present disclosure, a shape of the the signal line 202 may be changed, or the shape of the the signal line 202 and the shape of second signal line 204 are both changed, so as to reduce an overlapping area between the first overlapping region and the second overlapping region and reduce the step difference of the third signal line 206.

In some specific embodiments of the present disclosure, a gate metal line, a first insulation layer, a data signal line, a second insulation layer and a touch signal line are sequentially arranged in the non-display region of the array substrate. One of the gate metal line and the data signal line is the first signal line, the other one of the gate metal line and the data signal line is the second signal line, and the touch signal line is the third signal line. In such a manner, a large step difference at an intersection region where the touch control signal line crossing the display signal line is reduced, and a touch control problem is reduced.

Embodiments of the present disclosure further provide a display device, which includes the above array substrate.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", "includes", "include", "comprise", "comprises" or "comprising" and the like mean that an element or an article preceding the term contains elements or items and equivalents thereof behind the term, but does not exclude other elements or items. Such terms as "connect", "connected" or "connecting" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. An array substrate, comprising:
a base substrate, wherein the base substrate comprises a display region and a non-display region; and
at least three layers of signal lines insulated from each other and arranged in the non-display region, wherein the at least three layers of signal lines comprises first signal lines in a first layer and second signal lines in a second layer extending in an identical direction, and third signal lines in a third layer crossing the first signal lines and the second signal lines, a distance between each third signal line and the base substrate is larger than a distance between each first signal line and the base substrate and larger than a distance between each second signal line and the base substrate, an orthogonal projection of each first signal line on the base substrate overlaps an orthogonal projection of the corresponding third signal line on the base substrate to form a first overlapping region, an orthogonal projection of each second signal line on the base substrate overlaps an orthogonal projection of the corresponding third signal line on the base substrate to form a second overlapping region, and the first overlapping region partially overlaps, or does not overlap, the second overlapping region,
wherein each of the second signal lines comprises linear portions and protruding portions which are alternately arranged, an extending direction of each linear portion is perpendicular or substantially perpendicular to an extending direction of the third signal line, a protruding direction of each protruding portion is angled relative to the extending direction of the linear portion, and the first overlapping region partially overlaps, or does not overlap, an orthogonal projection of the corresponding protruding portion on the base substrate,
wherein an orthogonal projection of each protrusion portion on the base substrate is within the orthogonal projection of the corresponding third signal line on the base substrate.

2. The array substrate according to claim 1, wherein each of the protruding portions protrudes toward the extending direction of the third signal line.

3. The array substrate according to claim 1, wherein the protrusion portions correspond to the third signal lines respectively.

4. The array substrate according to claim 1, wherein a width of each protruding portion in the extending direction of the second signal line is smaller than or equal to a width of the third signal line in the extending direction of the second signal line.

5. The array substrate according to claim 1, wherein each of the first signal lines is a straight line.

6. The array substrate according to claim 5, wherein each of the protruding portions is of a right-angled U-shape.

7. An array substrate, comprising:
a base substrate, wherein the base substrate comprises a display region and a non-display region; and
at least three layers of signal lines insulated from each other and arranged in the non-display region, wherein the at least three layers of signal lines comprises first signal lines in a first layer and second signal lines in a second layer extending in an identical direction, and third signal lines in a third layer crossing the first signal lines and the second signal lines, a distance between each third signal line and the base substrate is larger than a distance between each first signal line and the base substrate and larger than a distance between each second signal line and the base substrate, an orthogonal projection of each first signal line on the base substrate overlaps an orthogonal projection of the corresponding third signal line on the base substrate to form a first overlapping region, an orthogonal projection of each second signal line on the base substrate overlaps an orthogonal projection of the corresponding third signal line on the base substrate to form a second overlapping region, and the first overlapping region partially overlaps, or does not overlap, the second overlapping region,
wherein each of the second signal lines comprises linear portions and protruding portions which are alternately arranged, an extending direction of each linear portion is perpendicular or substantially perpendicular to an extending direction of the third signal line, a protruding direction of each protruding portion is angled relative to the extending direction of the linear portion, and the first overlapping region partially overlaps, or does not overlap, an orthogonal projection of the corresponding protruding portion on the base substrate,
wherein each of the first signal lines is a straight line, each of the protruding portions is of a right-angled U-shape,
wherein a depth of a U-shaped groove of each protruding portion is equal to a width of the first signal line in the extending direction of the third signal line.

8. An array substrate, comprising:
a base substrate, wherein the base substrate comprises a display region and a non-display region; and
at least three layers of signal lines insulated from each other and arranged in the non-display region, wherein the at least three layers of signal lines comprises first signal lines in a first layer and second signal lines in a second layer extending in an identical direction, and third signal lines in a third layer crossing the first signal lines and the second signal lines, a distance between each third signal line and the base substrate is larger than a distance between each first signal line and the base substrate and larger than a distance between each second signal line and the base substrate, an orthogonal projection of each first signal line on the base substrate overlaps an orthogonal projection of the corresponding third signal line on the base substrate to form a first overlapping region, an orthogonal projection of each second signal line on the base substrate overlaps an orthogonal projection of the corresponding third signal line on the base substrate to form a second overlapping region, and the first overlapping region partially overlaps, or does not overlap, the second overlapping region, wherein each of the second signal lines comprises linear portions and protruding portions which are alternately arranged, an extending direction of each linear portion is perpendicular or substantially perpendicular to an extending direction of the third signal line, a protruding direction of each protruding portion is angled relative to the extending direction of the linear portion, and the first overlapping region partially overlaps, or does not overlap, an orthogonal projection of the corresponding protruding portion on the base substrate, wherein each of the first signal lines is a straight line, each of the protruding portions is of a right-angled U-shape, wherein the orthogonal projection of each first signal line on the base substrate does not overlap an orthogonal projection of a bottom of the U-shaped groove of the corresponding protruding portion on the base substrate.

9. The array substrate according to claim 1, wherein the first overlapping region does not overlap the second overlapping region.

10. The array substrate according to claim 1, wherein the third signal line is one of the at least three layers of signal lines farthest from the base substrate.

11. The array substrate according to claim 1, wherein a gate metal line, a first insulation layer, a data signal line, a second insulation layer and a touch signal line are sequentially arranged in the non-display region of the array substrate, one of the gate metal line and the data signal line is the first signal line, the other one of the gate metal line and the data signal line is the second signal line, and the touch signal line is the third signal line.

12. A display device, comprising the array substrate according to claim 1.

13. The array substrate according to claim 2, wherein the protrusion portions correspond to the third signal lines respectively.

14. The array substrate according to claim 2, wherein a width of each protruding portion in the extending direction of the second signal line is smaller than or equal to a width of the third signal line in the extending direction of the second signal line.

15. The array substrate according to claim 2, wherein each of the first signal lines is a straight line.

16. The array substrate according to claim 15, wherein each of the protruding portions is of a right-angled U-shape.

17. The array substrate according to claim 16, wherein a depth of a U-shaped groove of each protruding portion is equal to a width of the first signal line in the extending direction of the third signal line.

* * * * *